United States Patent
King et al.

(10) Patent No.: US 10,115,288 B2
(45) Date of Patent: Oct. 30, 2018

(54) AUTOMATIC BATTERY FLUID REMINDER SYSTEM FOR VEHICLES WITH FLOODED LEAD ACID BATTERIES AND METHOD THEREOF

(71) Applicant: INGERSOLL-RAND COMPANY, Davidson, NC (US)

(72) Inventors: Russell W. King, Evans, GA (US); Matthew S. Brackx, Evans, GA (US); Daniel J. Harris, Evans, GA (US)

(73) Assignee: INGERSOLL-RAND COMPANY, Davidson, NC (US)

(*) Notice: Subject to any disclaimer, the term of this patent is extended or adjusted under 35 U.S.C. 154(b) by 0 days.

(21) Appl. No.: 15/130,230

(22) Filed: Apr. 15, 2016

(65) Prior Publication Data

US 2017/0301210 A1 Oct. 19, 2017

(51) Int. Cl.
*G08B 21/18* (2006.01)
*G01R 31/36* (2006.01)
(Continued)

(52) U.S. Cl.
CPC ....... *G08B 21/182* (2013.01); *G01R 31/3679* (2013.01); *G01R 31/3689* (2013.01); *G08B 25/10* (2013.01); *H02J 7/0004* (2013.01)

(58) Field of Classification Search
CPC .............. G08B 21/182; G01R 31/3648; G01R 31/3651; G01R 31/3655; G01R 31/3679;
(Continued)

(56) References Cited

U.S. PATENT DOCUMENTS 3,648,189 A * 3/1972 Marchetti ............. H02J 7/0088
320/159
3,696,362 A 10/1972 Sieron
(Continued)

FOREIGN PATENT DOCUMENTS

JP 2008130308 A 6/2008
JP 2010257606 A 11/2010

*Primary Examiner* — Brian Zimmerman
*Assistant Examiner* — Sara Samson
(74) *Attorney, Agent, or Firm* — Jones IP Group; Wayne A. Jones

(57) ABSTRACT

An automatic battery fluid level monitoring system is provided. The automatic monitoring system includes a fluid consumption algorithm, programmed into a microprocessor based motor controller, connected through a communications link to a microprocessor based battery charger. The battery charger is electrically connected to a flooded type battery as well as a power connection such as being plugged into an outlet, the electrical connection from an alternator, or the like. Once the fluid consumption algorithm indicates that the fluid level is too low, a battery fluid indicator is activated utilizing a visual and/or audio display. After the battery is refilled, a fluid added reset is triggered, which deactivates the battery fluid indicator. Additional embodiments include utilizing a wired or wireless connection to a remote fleet management system, as well as alternative vehicle performance rules wherein the vehicle performance parameters can be purposefully altered to effect the ongoing performance of the vehicle.

17 Claims, 2 Drawing Sheets

(51) Int. Cl.
  *G08B 25/10* (2006.01)
  *H02J 7/00* (2006.01)
(58) Field of Classification Search
  CPC .. G01R 31/3689; H01M 2/362; H01M 10/48; H01M 10/484
  See application file for complete search history.

(56) References Cited

U.S. PATENT DOCUMENTS

| | | | |
|---|---|---|---|
| 3,891,465 | A | 6/1975 | Muto et al. |
| 4,010,410 | A * | 3/1977 | Kilbourn ............... H02J 7/022 307/150 |
| 5,453,334 | A | 9/1995 | Melichar |
| 6,106,968 | A | 8/2000 | Johnson et al. |
| 6,242,886 | B1 * | 6/2001 | Palanisamy ........... H02J 7/0075 320/100 |
| 6,653,843 | B2 | 11/2003 | Whitchurch |
| 6,786,226 | B2 | 9/2004 | Crook et al. |
| 7,812,613 | B2 | 10/2010 | Jones et al. |
| 7,996,098 | B2 | 8/2011 | Dickinson et al. |
| 8,431,277 | B2 | 4/2013 | Orihashi |
| 8,546,006 | B2 | 10/2013 | Beckley et al. |
| 8,928,326 | B2 | 1/2015 | Jones et al. |
| 2004/0175598 | A1 | 9/2004 | Bliven et al. |
| 2005/0001628 | A1 * | 1/2005 | Jones ..................... B66F 9/24 324/432 |
| 2010/0019773 | A1 | 1/2010 | Son |
| 2010/0292942 | A1 * | 11/2010 | Golf .................... H01M 10/443 702/63 |
| 2011/0128154 | A1 | 6/2011 | Herrema et al. |
| 2012/0058369 | A1 * | 3/2012 | Beckley ................ H01M 2/362 429/50 |
| 2012/0109437 | A1 * | 5/2012 | Iwase ..................... B66F 9/24 701/22 |
| 2013/0009782 | A1 * | 1/2013 | Brandt .................. H01M 10/06 340/657 |
| 2013/0033102 | A1 * | 2/2013 | Goff ...................... H02J 7/0014 307/10.6 |
| 2013/0149628 | A1 | 6/2013 | Ogawa et al. |
| 2014/0312831 | A1 * | 10/2014 | Lewis ................. B60L 11/1822 320/107 |
| 2015/0210180 | A1 * | 7/2015 | Hua .................... H01M 10/484 701/32.3 |
| 2015/0326037 | A1 * | 11/2015 | Borhan .................. G01R 31/36 320/162 |
| 2015/0362557 | A1 * | 12/2015 | Takashima ........... H01M 10/48 324/426 |
| 2016/0071339 | A1 * | 3/2016 | Yuasa .................... G07C 5/008 340/636.16 |
| 2016/0190824 | A1 * | 6/2016 | Brackx .................. H02J 7/027 320/162 |

* cited by examiner

AUTOMATIC BATTERY FLUID REMINDER SYSTEM FOR VEHICLES WITH FLOODED LEAD ACID BATTERIES AND METHOD THEREOF

BACKGROUND

Technical Field

The present disclosure relates to systems relating to flooded lead acid or other similar type batteries.

State of the Art

Much of today's machinery, especially machinery that requires or produces power, such as automobiles, golf carts, and the like, utilize a battery as an essential part of its systems. Flooded lead-acid batteries, which "flood" the plates with some form of electrolytic fluid such as water and acid, are the most prevalent type of battery used.

One of the inherent problems associated with flooded type batteries, is that during the charging phase of the battery's cycle, the fluid evaporates and passes as vapor though valves in the battery casing to relieve the pressure that is building up within the battery. This "out gassing" of the battery causes the fluid level within the battery to slowly drop. When the fluid level drops below certain levels it exposes the plates within to air. Not keeping the plates fully submerged within the electrolytic fluid decreases the battery's efficiency and life span.

It would therefore be advantageous to provide a system which would provide an accurate indication of the fluid levels within the battery and alert the operator or technician of the vehicle to take appropriate measures.

SUMMARY

The present disclosure relates to systems relating to flooded lead acid or other similar type batteries.

An aspect of the present disclosure includes a battery fluid level monitoring system comprising a battery having an internal fluid and a fluid level monitoring system in operative communication with the battery, wherein the fluid level monitoring system calculates consumption of the internal fluid based on a parameter, the fluid level monitoring system determines a level of the internal fluid based on the consumption and compares the level with a predetermined level, and when the level of the internal fluid is equal to or less than the predetermined level, the fluid monitoring system communicates a warning.

Another aspect of the present disclosure includes a method of producing an automatic battery fluid level monitoring system comprised of calculating consumption of the internal fluid of a flooded type battery based on a parameter, comparing the level of the internal fluid based on the consumption with a predetermined level, and communicating a warning when the level of the internal fluid is equal to or less than the predetermined level.

The foregoing and other features, advantages, and construction of the present disclosure will be more readily apparent and fully appreciated from the following more detailed description of the particular embodiments, taken in conjunction with the accompanying drawings.

BRIEF DESCRIPTION OF THE DRAWINGS

Some of the embodiments will be described in detail, with reference to the following figures, wherein like designations denote like members.

DETAILED DESCRIPTION OF EMBODIMENTS

A detailed description of the hereinafter described embodiments of the disclosed apparatus and method are presented herein by way of exemplification and not limitation with reference to the Figures listed above. Although certain embodiments are shown and described in detail, it should be understood that various changes and modifications may be made without departing from the scope of the appended claims. The scope of the present disclosure will in no way be limited to the number of constituting components, the materials thereof, the shapes thereof, the relative arrangement thereof, etc., and are disclosed simply as an example of embodiments of the present disclosure.

As a preface to the detailed description, it should be noted that, as used in this specification and the appended claims, the singular forms "a", "an" and "the" include plural referents, unless the context clearly dictates otherwise.

The drawings depict illustrative embodiments of a fluid level monitoring system 10 for a battery 24, such as a flooded lead acid battery. These embodiments may each comprise various structural and functional components that complement one another to provide the unique functionality and performance of the battery fluid level monitoring system 10, the particular structure and function of which will be described in greater detail herein.

Figure 1:
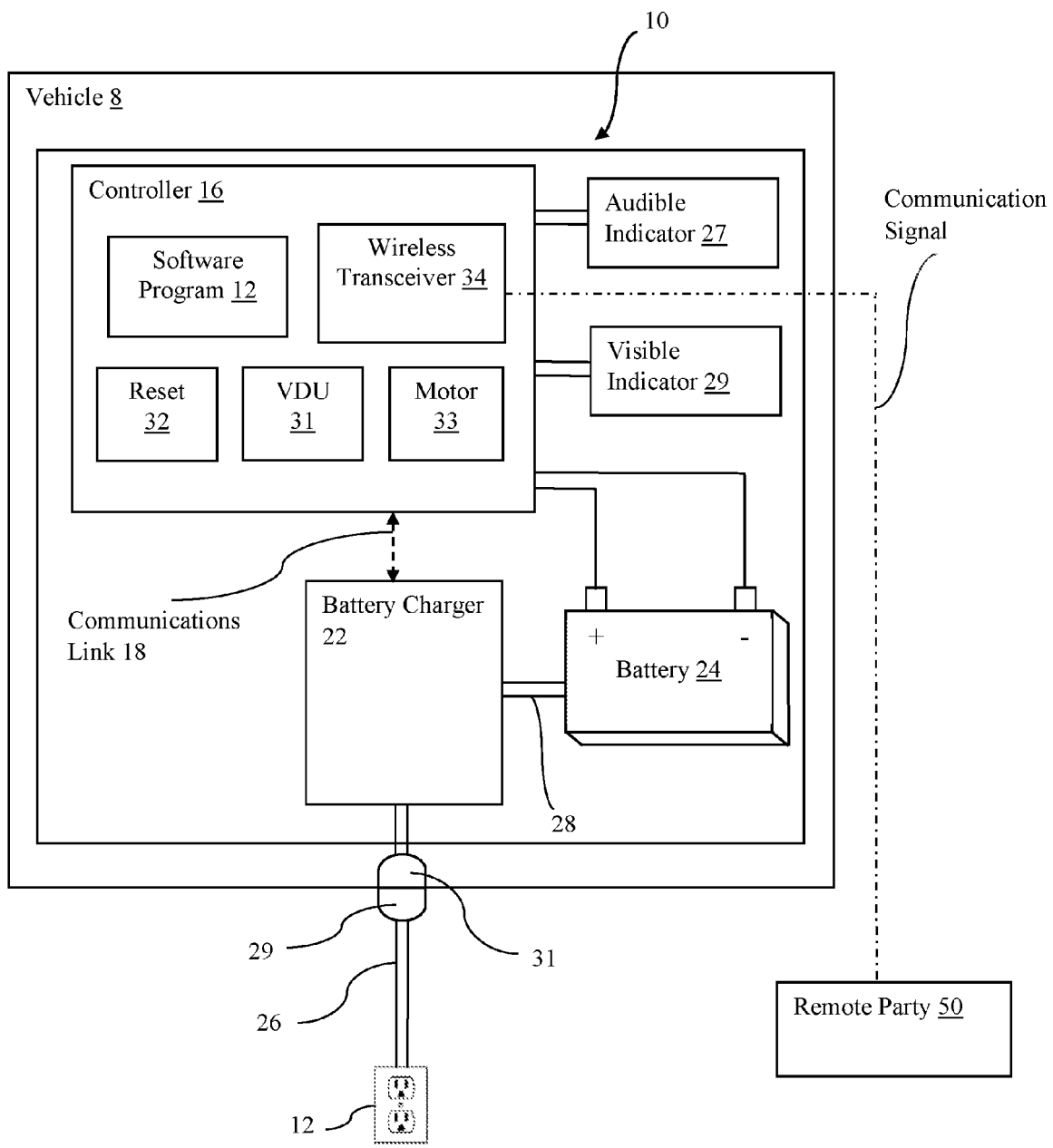
FIG. 1 is an illustrative embodiment of an automatic fluid level monitoring system for the electrolyte fluid levels of flooded type battery in accordance with the present disclosure.

Referring to the drawings, FIG. 1 depicts an illustrative embodiment of a battery fluid level monitoring system 10. Embodiments of the battery fluid level monitoring system 10 may comprise a microprocessor-based motor controller 16, a battery fluid consumption software program 12, and microprocessor-based battery charger 22, a communications link 18 operatively coupling the motor controller 16 and the battery charger 22 to one another, and a battery 24, such as a battery pack or the like.

Embodiments of the monitoring system 10 may comprise a micro-processor based motor controller 16. The controller 16 may comprise a microprocessor 14. The microprocessor 14 may provide the computational and logical control processing capabilities that empower the controller 16 to govern the operational aspects of the propulsion system (not depicted) of an electric device, such as a motor of an electric vehicle 8. The controller 16 may be capable of controlling, operating, monitoring, governing, or otherwise directing the operational aspects of the vehicle 8, including for example, but not limited thereto, the operations of the propulsion mechanism to propel the vehicle 8, the operations of on-board software, the operations of a GPS unit (not depicted), the operations of a visual display unit (VDU) 31, the operations of a wireless transceiver 34, the operations of the battery charger 22, the operations of one or more status indicators 27 and 29 of the vehicle 8, and the charging and discharging of the battery 24. During operation of the vehicle 8, the controller 16 may be configured to direct power from the battery 24 to the propulsion mechanism to facilitate the movement of the vehicle 8, in response to user inputs, such as, for example, the user depressing the pedal of the accelerator. In other words, based on user input received and processed by the controller 16, the battery 24 may be directed by the controller 16 to deliver electrical energy to the propulsion mechanism, such as the motor, to operate the motor and drive the vehicle 8.

Embodiments of the monitoring system 10 may comprise the controller 16 having memory for storage capabilities, such as one or more hard drives, solid state drives, and/or RAM or the like. The controller 16 may thereby be configured to store therein a software program 12 containing an algorithm that is accessible to and utilized by the microprocessor 14. The algorithm may be a battery fluid consumption algorithm, capable of computing the consumption of a fluid within a battery 24 over a duration of time and/or after charging based on one or more parameters. The controller 16 may therefore be in operative communication with the battery 24 to sense, tally, or otherwise measure, these parameters described herein.

Embodiments of the monitoring system 10 may comprise battery charger 22. The battery charger 22 may be a microprocessor-based, high-frequency, solid state device, capable of electrically coupling a power source 26 to a battery 24 for the purpose of recharging the battery 24. The battery charger 22 may further comprise a microprocessor or controller 20 configured to control and govern the operational aspects of the charger 22, including, but not limited to, the execution of the on-board software, the storing of charging and operational information in a memory, the real-time monitoring of changes in voltage in the battery 24 to deliver the appropriate charge to the battery 24, and the modification of the charge cycle depending on the needs of the battery 24 and the instruction received from the motor controller 16 through the communications link 18, to be described in greater detail herein.

Embodiments of the monitoring system 10 may comprise a battery 24. The battery 24 may be a battery system having a single battery, a bank of batteries, a bank of batteries with a dedicated controller, or the like. For example, the battery 24 may be configured as a 48 V 100 Ah battery, or other similar battery. Embodiments of the monitoring system 10 may comprise the battery 24 being a power source for an electric-powered device. Embodiments of the monitoring system 10 may comprise the battery 24 being part of a vehicle 8, such as a golf cart, utility vehicle, forklift, passenger vehicle or the like. The battery 24 may serve as the sole source of power to propel the vehicle 8, as in a traction battery pack for golf carts and utility vehicles, while in others the battery 24 may function as a supplemental power source, as with a hybrid drive.

Embodiments of the monitoring system 10 may further comprise the battery charger 22 being positioned internally to the vehicle 8 with a direct current (DC) cable 28 coupled between the battery charger 22 and the battery 24, as exemplarily depicted in FIG. 1. As such, the battery charger 22 may be integral with the vehicle 8. In such embodiments, when the battery 24 needs to be recharged, a plug 29 at the end of the AC cable 26 may be inserted into a corresponding plug port 31 on the vehicle 8 to thereby supply power from the power source 26 to the vehicle 8, and in particular to the battery 24 on the vehicle 8. In alternative embodiments of the monitoring system 10, the battery charger 22 may be positioned externally to the vehicle 8 to thus be separate and independent from the vehicle 8, but yet maintain the functionality of the battery charger 22 described herein once coupled to the vehicle 8 to recharge the battery 24.

Embodiments of the monitoring system 10 may further comprise a communications link 18 that may operatively couple the motor controller 16 to the battery charger 22. The communications link 18 may be configured to allow the motor controller 16 and the battery charger 22 to communicate one with another, to transfer data, instructions, directives, and/or signals to one another to influence the behavior and operational aspects of one another, to be described herein.

Embodiments of the monitoring system 10 may comprise the controller 16 being configured to govern one or more of the operational aspects of the vehicle 8 based on inputs received by the controller 16 from such components as, for example, the battery 24, the battery charger 22, software program 12, and/or the reset 32. The controller 16 may be configured to receive and/or send electrical and data communication to one or more of the wireless transceiver 34, the VDU 31, the audible indicator 27, the visible indicator 29, the reset 32, the software program 12, and/or the motor 33, as described herein and as schematically depicted in FIG. 1, to control and govern the operational aspects thereof. Indeed, one or more communication buses may be configured between component parts of the system 10, as needed, to provide adequate communication capability therebetween, as described herein.

Embodiments of the battery monitoring system 10 may further comprise a visual display unit (VDU) 31. The VDU 31 may be an electronic display device, such as an LCD or OLED screen or the like, to display information about the vehicle 8, the battery 24, the battery charger 22, and/or other operational aspects of the vehicle 8, including a GPS location and the like. The VDU 31 may be utilized to display messages or other information regarding the current status, proper use, or operational features of the vehicle 8, the battery 24, or the like. The VDU 31 may also be an input device, such as a user interface, for a user to utilize to access, control, and/or manipulate the various components of the vehicle 8 or the battery monitoring system 10. For example, the VDU 31 may be a touch screen display or other user-interactive display that may provide access to the computer program 12 and other internal controls.

Further in example, the VDU 31 may be configured to govern and/or utilize a communication control device, such as a wireless transceiver 34. The wireless transceiver 34 may be configured to communicate a wireless communication signal to a remote or third party 50, to be described in greater detail herein. For example, using the capability of the VDU 31, a wireless communication signal may be sent by a user thereof via a web server, a wireless network, Bluetooth, Wi-Fi, a cellular or mobile network, and/or other wireless communication means by the wireless transceiver 31 to the remote or third party 50 to provide information to the third party 50 about a particular vehicle 8 and its operational status, including historical status and real-time status of the various components of the vehicle, including the battery 16.

Embodiments of the battery monitoring system 10 may further comprise one or more status indicators configured to communicate one or more operational aspects of the battery charger 22, the battery 16, and/or the vehicle 8 to the third party 50, such as an operator, attendant, computer terminal, fleet manager, and/or user. For example, when the controller 16 of the vehicle 8 determines by the algorithm or software program 12 that the fluid level of the battery 24 is at or below acceptable levels or predetermined acceptable levels, the controller 16 may instruct an audible indicator 27 on the vehicle 8 to sound an audible signal to alert the third party 50 that fluid should be added to the battery 24. The audible indicator 27 may be a buzzer, beeper, or other audible device capable of making an audible noise/alert, such as a speaker.

Embodiments of the battery monitoring system 10 may comprise the audible indicator 27 being an indicator that is customarily used on golf carts and other utility vehicles to indicate the vehicle 8 is in reverse mode. For example, when a transmission control or other equivalent directional control of the vehicle 8 is placed into a reverse setting, the controller 16 may be configured to actuate the audible indicator 27 to generate a beep, buzz, or similar sound. The controller 16 can be configured to actuate the same audible indicator 27 when the fluid levels in the battery 24 are at or below a predetermined level or amount. The audible indicator 27 may be an additional indicator, but need not be as the existing audible indicator of the vehicle 8 may be used. Moreover, as suggested, the same audible sound may be used to indicate both charging and reverse mode, but embodiments of the charging system 10 may include different audible sounds, different audible sound patterns, and/or different audible sound tones being generated for reverse and for charging, to thereby distinguish therebetween. Further still, the controller 16 may be configured to instruct the VDU 31 and/or the on-board speakers of the vehicle 8 to be the audible indicator 27 to generate the audible alert for low levels of battery fluid in the battery 24.

In addition or in the alternative, the battery monitoring system 10 may further comprise a visual indicator 29 to communicate an operational status of the battery charger 22, the battery 16, and/or the vehicle 8 to the third party 50, such as an operator, attendant, remote fleet manager, remote computer terminal, and/or user. For example, although the audible indicator 27 has been herein described in association with battery fluid level status, the visual indicator 29 may be used to additionally or alternatively communicate battery fluid level status to the third party 50. That is, the visual indicator 29 may be used separately from the audible indicator 27 or as a supplement to the audible indicator 27. For example, embodiments of the battery monitoring system 10 may comprise the controller 16, in response to the determination by the algorithm or software program 12 that the internal fluid in the battery 24 is below acceptable minimum levels, instructing the visible indicator 29 to turn on or otherwise illuminate. Further in example, embodiments of the battery monitoring system 10 may comprise the controller 16, in response to the determination by the algorithm or software program 12 that the internal fluid in the battery 24 is below acceptable minimum levels, utilizing the VDU 31 to visually indicate to the third party 50 one or more operational aspects of the battery charger 22, the battery, or the vehicle 8 itself. The controller 16 may instruct the VDU 31 to display an acknowledge button or icon, even digital, that may permit the third part 50 to silence the audible indicator 27. The controller 16 may further provide instructions to the third party 50 as to what additional steps, if any, may need to be taken to ensure proper internal fluid levels within the battery 24.

Embodiments of the monitoring system 10 may further comprise at least a software program 12, mentioned above, that has one or more computer programs or algorithms, which are executed and run by the microprocessor, that are configured to measure, calculate, analyze, gauge, compare, estimate, or otherwise determine, battery fluid levels within the battery 24 based on one or more parameters. The parameters may be, for example, a duration of time the battery 24 is in a discharging state, a duration of time the battery 24 is in a charging state, a duration of time the battery 24 is in a stand-by state, a duration of time the battery 24 is in a storage state, a duration of time the battery 24 is in an off-gassing state during charge, or any combination of the foregoing. These durations of time may be measured by a timer (not depicted) configured within the battery charger 22 and/or motor controller 16. Additional parameters, such as, temperature, pressure, charge rate, discharge rate, and the like may also be measured and/or sensed by the system 10, the battery charger 22 and/or the motor controller 16. The parameters may be, for example, an accumulated amount of time the battery 24 has spent in one or more charge cycles or discharge cycles, or the accumulated amount of time for any of the parameters described herein, such as the amount of time the battery 24 spends in the any of the phases of charging, including the gassing phase. The parameters may be, for example, a predetermined initial level of internal fluid in the battery 24, as well as a predetermined minimum level of internal fluid in the battery 24 that is acceptable for the battery 24 to continue to be used without damaging the battery 24.

Using one or more of these parameters as inputs, the software program 12 may be able to calculate or determine the amount of internal fluid that escapes from the battery 24 in the form of vapor or gas. The program 12 may calculate, estimate, gauge, compute, or otherwise determine the amount of internal fluid that escapes from the battery 24 in the form of vapor or gas, as a function of the time that the battery is being charged or as a function of a specific phase of the charge, including the gassing phase. Indeed, the software program 12 may calculate a theoretical loss, or consumption, of internal fluid within the battery 24 based on the parameters measured and received. Once the program 12 has calculated or estimated the amount of fluid lost or consumed, the program 12 may estimate the new, or current, level of internal fluid within the battery 24 by subtracting the calculated lost or consumed amount from the previous known amount to arrive at the current estimated amount remaining or current fluid level. The program 12 may then compare the new, or current, level of internal fluid to the predetermined acceptable minimum level to determine if the current level is above, at, or below the predetermined minimum level. The program 12 may then instruct the controller 16 to take appropriate actions based on the determination and comparison, to be described in greater detail.

Embodiments of the battery monitoring system 10 may further comprise the software program 12 and algorithm utilizing the accumulated time the battery 24 spends in the gassing phase of the charge cycle. Due to the fact that variables such as temperature and pressure are known, or can readily be determined by the system 10 through appropriate sensors (not depicted), the amount of fluid escaping from the battery 24 in the form of vapor or gas can be calculated as a function of the accumulated time that the battery 24 has been and/or is being charged. In other words, the algorithm can count the amount of time that the battery has been and/or is in the "gassing phase" during the charging cycle and predict the theoretical amount of internal fluid consumed. Thereby, the algorithm may calculate the amount of internal fluid left in the battery casing of the battery 24 at any given time.

Embodiments of the battery monitoring system 10 may further comprise the software program 12 and algorithm storing and referencing tabulated values of a minimum safe level, or volume, of electrolyte fluid for each particular battery type and size. Minimum safe levels of electrolyte fluid in each battery 24 may be based on the prescribed or theoretical volume of the fluid within the battery casing. The minimum safe level may be the lowest level the fluid can attain and still cover the lead plates completely without allowing them to be exposed to air. This minimum safe level may be calculated by subtracting the volume of space above the plates from the overall volume of the fluid within the battery 24 at its maximum filled level. The minimum safe level can be recalibrated individually for different types of batteries, or generalized to all similar battery types with a margin of error added. Once a minimum fluid level is established, the minimum fluid level may be set as a parameter within the algorithm.

Embodiments of the battery monitoring system 10 may further comprise the controller 16 being configured to take appropriate action and govern operational aspects of the charger 22, battery 24, and/or vehicle 8 according to the calculated, measured, and/or estimated fluid levels of the internal fluid level of the battery 24. For example, the controller 16 may be configured to sound an audible alert by way of the audible indicator 27 and/or display a visual alert by way of the visible indicator 29 should the internal fluid levels of the battery 24 fall below the predetermined levels. Moreover, the motor controller 16 may also be configured display an audible and/or visual alert by way of the VDU 31, such as for example a digital battery watering visual reminder icon should the internal fluid levels of the battery 24 fall below the predetermined levels. Again, these fluid levels may be calculated or theoretical fluid levels based on the calculations of the program 12, and even the algorithms contained therein.

Embodiments of the battery monitoring system 10 may further comprise the controller 16 being configured to take appropriate action and govern operational aspects of the program 12, charger 22, battery 24, and/or vehicle 8 according to the electrical connectivity between the battery 24 and the charger 22. For example, as mentioned herein, the motor controller 16 may be configured to monitor the battery 24 and/or the battery charger 22 to detect an electrical connection between the charger 22 and the battery 24. In other words, the controller 16 may monitor whether or not the battery 24 is plugged into the charger 22, which would establish an electrical connection therebetween. Indeed, embodiments of the battery monitoring system 10 may comprise the controller 16 and the program 12 working together to detect the initial charging connection between the battery 24 and the charger 22 to thereafter execute the steps of the program 12, which is discussed in greater detail herein.

Embodiments of the battery monitoring system 10 may comprise other means by which the system 10 and the controller 16 may communicate the status of the low fluid levels within the battery 24 to the third party 50. For example, embodiments of the battery monitoring system 10 may comprise the controller 16 communicating a battery fluid level warning to a remote party 50 or third party, which may be a user, a display, a computer terminal, an internet-enabled device, a base station, a fleet manager, a maintenance station, or the like. The system 10 may comprise a wireless transceiver 34 in communication with the controller 16 that can be configured to wirelessly connect to a communications network, web server, or other internet-enabled devices, and/or the internet through WiFi, cellular modem, Bluetooth, or other similar wireless technology. As such, the controller 16 may be configured to direct the wireless communication with the third party 50, even in real-time, regarding the status of fluid levels within the battery 24. For example, if and when the system 10 determines the battery fluid levels are below acceptable minimum levels, the controller 16 and the wireless transceiver 34 may function to wirelessly transmit a signal or communication, such as an alert, e-mail, text message, social media post, or the like, to the third party 50. The communication may include such information as site name, site location, site identification, vehicle number, and time of detection, for example, so that the operator can attend to the specific vehicle in question.

Embodiments of the battery monitoring system 10 may further comprise a reset 32, wherein once the audio or visual warning is acknowledged and the battery 24 has been refilled with water, even distilled or deionized water, the battery monitoring system 10 may be reset to allow the algorithm to restart and calculate the fluid level accurately over again. The reset 32 may reset the timer used by the algorithm to determine the fluid loss or consumption and may reset the initial battery fluid levels. The reset 32 may be a manually operated control configured on the vehicle 8 or on the VDU 31 that once pressed by the user, may reset the system 10. Alternatively, the reset 32 may be remotely actuated by the third party 50 sending a command to the controller 16 via the transceiver 34 to reset the parameters utilized by the algorithm to calculate battery fluid levels.

However, if the warning signals sent from the controller 16 are ignored and the internal fluid levels are not filled or the fluid level reset 32 has not been triggered, at least within a minimum time frame, additional protocols can be put into place (a minimum time frame may include the number of times the warning has repeatedly signaled without reset, an actual specified amount of time (hours, days, or weeks), a certain number of charge cycles that the battery is subjected to without the system being filled and reset, or any other parameter that is deemed to be appropriate). For example, the controller 16 may be configured to purposefully alter performance parameters or characteristics of the vehicle 8 should the low internal fluid level warnings be ignored or go untreated. Such performance alternations, i.e., diminished power and performance, may serve to remind, compel, motivate, or otherwise urge, a user of the need to refill the internal fluid levels of the battery 24 to avoid irreversible damage to the battery 24. For example, the controller 16 may alter such vehicle performance parameters as reducing vehicle speed, enunciating a reverse buzzer, or possibly even preventing vehicle use until the low battery fluid is acknowledged and addressed. The controller 16 may be configured to control and/or limit the power available from the battery 24 to the motor 33 to reduce the power delivered to the drive system of the vehicle 8, thus reducing vehicle speed and acceleration. In addition, the controller 16 may be configured, through the software program 12 or other software configuration, to reduce or otherwise limit the top speed available to the vehicle 8 or the maximum acceleration of the vehicle 8. In addition, the controller 16 may actuate, even repeatedly, the audible indicators 27 and/or visible indicators 29 to attract the attention of, or even annoy, the user, operator, controller, fleet manager or any other entity that might be able to address the low battery fluid levels so that the user, operator, etc. can see to it that the battery fluid levels are attended to and filled. Should the warning signals sent from the controller 16 regarding the low internal battery fluid levels continue to be ignored, such that the internal fluid levels are not filled and the fluid level reset 32 is not triggered within a maximum allotted measurement of time, charge cycles, or repeated warnings, the controller 16 may be configured to cut off the power available from the battery 24 to the motor 33 to eliminate the power delivered to the drive system of the vehicle 8, thus preventing operation of the vehicle 8 until the internal battery fluids are addressed.

The controller 16 may also be configured to purposefully alter the charging mode of the battery charger 22 should the internal battery fluid, as estimated by the algorithm, fall below the predetermined minimum fluid level. The controller 16 may be configured to limit the battery charger 22 to a lower charge voltage (for example, 13.2 volts instead of 13.6 volts while charging a 12-volt battery) in order to reduce the amount of out gassing or off gassing that occurs within the battery 24 during charging, thereby reducing the amount of fluid loss or consumption.

Figure 2:
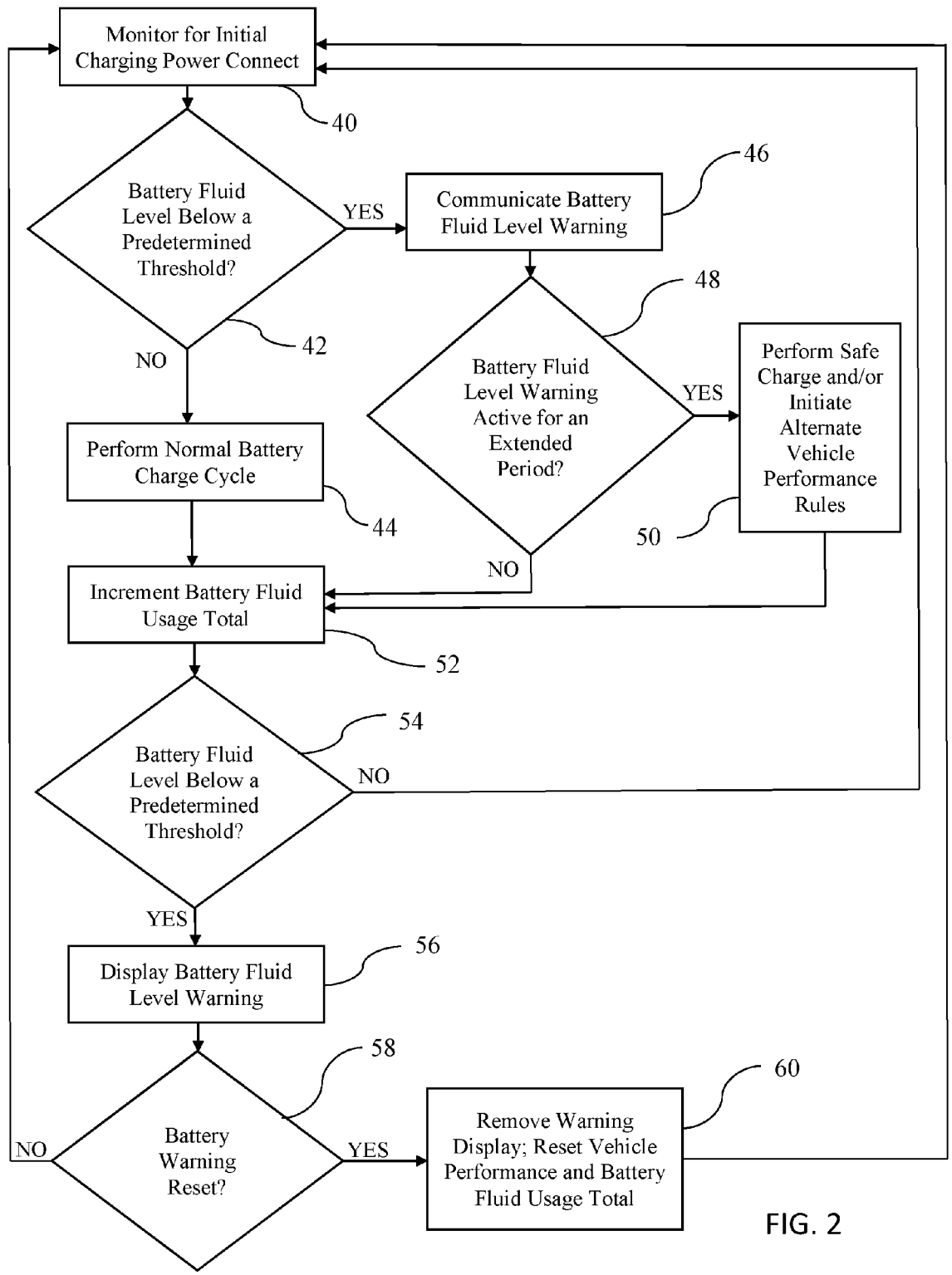
FIG. 2 is a flowchart of an algorithm employed by the microprocessor based motor controller which controls the automatic monitoring system for the electrolyte fluid levels of flooded type battery in accordance with the present disclosure.

With reference to FIG. 2, embodiments of the battery fluid level monitoring system 10 may further compromise a method of monitoring the internal fluid level of the battery 24. The method may comprise filling a battery 24 to its maximum internal fluid level. The method may further comprise the program 12 storing this predetermined maximum level of internal fluid for the battery 24 in the controller 16. The method may further comprise the program 12 adjusting a theoretical or calculated level of internal fluid based on a calculated or estimated amount of internal fluid lost due to the actual and measured amount of time the battery 24 spends in one or more phases of a charge cycle. For example, the program 12 may calculate the amount of internal fluid lost as a factor of real time the battery 24 has spent in one or more phases of the charge cycle. Using the calculated amount of fluid lost, the program 12 may theoretically adjust the maximum level of internal fluid within the storage of the controller 16 to thereby arrive at a current, real-time estimated level of internal battery fluid. The method may comprise the program 12 storing this current, real-time estimated fluid level and comparing the current, real-time estimated fluid level against a predetermined safe internal fluid level. The method may comprise the program 12 instructing the controller 16 to take particular actions based on this comparison.

With further reference to FIG. 2, embodiments of the method of monitoring the internal fluid level of the battery 24 may comprise monitoring an electrical connection between the battery 24 and the charger 22 to initiate the program 12, as depicted in step 40. For example, upon the controller 16 sensing or detecting the electrical coupling of the battery 24 and the charger 22, the program 12 may be initiated. Once the program 12 is initiated, the method may comprise comparing a current, real-time estimated internal fluid level of the battery 24 to a predetermined safe level of internal fluid for the battery 23, as depicted in step 42. Once compared, the program 12 may instruct the controller 16 to take one or more appropriate actions.

For example, should the estimated or calculated internal fluid level be above the predetermined safe level, the controller 16 may instruct the charger 22, through the communications link 18, to perform a normal charge of the battery 24, as depicted in step 44. That is, the charger 22 may charge the battery 24 at the normal voltage at which the charger 22 normally or typically charges the battery 24. As the charger 22 charges the battery 24 in a normal mode, the program 12 may calculate the estimated and theoretical internal fluid lost from the battery casing during the charging of the battery 24 based on the time the battery 24 spends in one or more stages of the charge cycle, say for example the off-gassing stage. Thereafter, the program 12 may instruct the controller 16 to increment the battery fluid usage total by the theoretical amount lost during the latest charge of the battery 24, as depicted in step 52.

On the other hand, should the estimated or calculated internal fluid level be below the predetermined safe level in step 42, the program 12 may instruct the controller 16 to communicate, as depicted in step 46, a fluid level warning to a remote party 50 or third party, which may be a user, a display, a computer terminal, an internet-enabled device, a base station, a fleet manager, a maintenance station, or the like. In addition, the program 12 may instruct the controller 16 to activate, as a warning indicator, one or both of the audible indicator 27 and the visible indicator 29 to alert users, operators, or the like to the problem of the low internal fluid levels of the battery 24.

Embodiments of the method may comprise the controller 16 tracking the amount of time the battery fluid level warning has been active, or even the number of times the battery fluid level warning has been repeatedly activated, and comparing these measured values to a predetermined value, as depicted in step 48. For example, these measured values may be, for example, the number of times the warning has repeatedly signaled without reset, an actual specified amount of time (hours, days, or weeks), a certain number of charge cycles that the battery is subjected to without the system being filled and reset, or any other parameter that is deemed to be appropriate. Should the measured values of the warning be less than the corresponding predetermined value, the program 12 may instruct the controller 16 to increment the battery fluid usage total by the theoretical amount lost during the latest charge of the battery 24, as depicted in step 52. On the other hand, should the measured values of the warning be greater than the corresponding predetermined value, the program 12 and/or the controller 16 may begin to implement safe charging cycles for the charger 22 and the battery 24, as well as begin to alter the performance parameters of the vehicle 8, as depicted in step 50. The safe charging cycle and the altered performance parameters have been described herein. Once the safe charging cycle(s) and the altered performance parameters have been initiated or set in place, the program 12 may instruct the controller 16 to increment the battery fluid usage total by the theoretical amount lost during the latest charge of the battery 24, as depicted in step 52.

Once the battery fluid usage level has been incremented, as heretofore described, so as to arrive at a new and updated calculated/estimated internal fluid level, the method may comprise comparing the new and updated calculated/estimated internal fluid level of the battery 24 to the predetermined safe level of internal fluid for the battery 23, as depicted in step 54. Once compared, the program 12 may instruct the controller 16 to take one or more appropriate actions.

For example, should the new and updated internal fluid level be below the predetermined safe level, the program 12 may instruct the controller 16 to merely display the battery fluid level warning, as depicted in step 56, without yet having had to communicate the warning, as depicted in step 46. Such may be the case when the step 56 is the first or initial time the program 12 instructs the controller 16 to send a warning of any kind. However, as described above, should the warning be ignored or if the initial comparison of the calculated internal fluid levels be below the predetermined level, as determined by the step 42, the program 12 may instruct the controller 16 to communicate the warning, as described herein with regard to step 46. After the battery fluid level warning has been displayed, according to the step 56, the program 12 may instruct the controller 16 to determine whether the system is reset. Under the condition an operator, user, or the like fills the internal fluid levels of the battery 24 back to the maximum internal fluid level, the operator, user, or the like may operate the reset to reset the system back to initial status. Resetting the system may remove the safe charge restrictions as well as the restrictive performance parameters of the vehicle. Once the system 10 is reset and the restrictions are lifted, the system 10, the controller 16, and/or the program 12 may await the electrical coupling of the charger 22 to the battery 24, as depicted in the step 40, that will charge the battery 24 once again and begin the operations of the system 10 once anew. However, if the system 10 is not reset, the program 12 may instruct the controller 16 to await another electrical coupling event between the charger 22 and the 24, as depicted in the step 40, so that the program can determine that the calculated battery fluid level is still below the predetermined threshold, according to the step 42, so that the program 12 and the controller 16 may communicate the battery fluid level warning to the remote party 50 and/or to the audible and visible indicators 27 and 29 on the vehicle itself, according to the step 46. And, under a worst case scenario, wherein the battery fluid level warning is ignored beyond the maximum permitted values, the program 12 and the controller 16 may shut down the vehicle, according to the step 50.

While this disclosure has been described in conjunction with the specific embodiments outlined above, it is evident that many alternatives, modifications and variations will be apparent to those skilled in the art. Accordingly, the preferred embodiments of the present disclosure as set forth above are intended to be illustrative, not limiting. Various changes may be made without departing from the spirit and scope of the present disclosure, as required by the following claims. The claims provide the scope of the coverage of the present disclosure and should not be limited to the specific examples provided herein.

What is claimed is:

1. A battery fluid level monitoring system comprising:
a battery having an internal fluid;
a fluid level monitoring system in operative communication with the battery, wherein the fluid level monitoring system calculates consumption of the internal fluid based on a parameter,
wherein the fluid level monitoring system determines a level of the internal fluid based on the consumption of the internal fluid and compares the level with a predetermined level,
wherein when the level of the internal fluid is equal to or less than the predetermined level the fluid monitoring system communicates a warning; and
a battery charger in operative communication with the battery, and wherein when the level of the internal fluid is greater than the predetermined level the fluid level monitoring system instructs the battery charger to begin charging the battery, and
wherein the fluid level monitoring system measures a duration of the warning and compares the duration with a predetermined duration, wherein when the duration of the warning is greater than the predetermined duration the fluid level monitoring system alters a charge cycle of the battery to reduce the consumption of the internal fluid.

2. The system of claim 1, wherein the parameter is a calculated quantity of fluid evaporation.

3. The system of claim 1, wherein the parameter is a calculated quantity of fluid consumed during a gassing phase of a charge cycle of the battery.

4. The system of claim 1, wherein the calculated consumption of the internal fluid is theoretical.

5. The system of claim 1, wherein the warning is wirelessly transmitted to a remote location.

6. The system of claim 1, wherein the warning is displayed on a display.

7. The system of claim 1, wherein in response to the warning, the fluid level monitoring system is manually or wirelessly reset and the consumption of the internal fluid is set to zero.

8. The system of claim 1, further comprising a vehicle, wherein when the duration of the warning is greater than the predetermined duration the fluid level monitoring system alters performance parameters of the vehicle.

9. The system of claim 8, wherein the performance parameters are one or more of vehicle top speed, vehicle acceleration, vehicle horn operation, vehicle reverse buzzer operation, and vehicle start.

10. The system of claim 8, wherein the warning includes information related to vehicle location, vehicle identification number, and time of warning.

11. The system of claim 1, wherein the fluid level monitoring system further comprises a motor controller in operative communication with the battery charger.

12. The system of claim 1, further comprising a charge sensor, wherein the charge sensor senses an electrical coupling between the battery and the battery charger.

13. A method of monitoring a fluid level in a battery, the method comprising:
calculating by an algorithm a consumption of the internal fluid of a flooded-type battery based on a parameter;
comparing a level of the internal fluid based on the consumption with a predetermined level;
communicating a warning when the level of the internal fluid is equal to or less than the predetermined level;
instructing a battery charger to begin to charge the flooded-type battery when the level of the internal fluid is greater than the predetermined level;
measuring a duration of the warning and comparing the duration with a predetermined duration; and
altering a charge cycle of the battery to reduce the consumption of the internal fluid when the duration of the warning is greater than the predetermined duration.

14. The method of claim 13, wherein the consumption of the internal fluid is a theoretical calculation by the algorithm and the parameter is a duration of time the battery spends in a gassing phase during charging.

15. The method of claim 13, further comprising displaying the warning on a display or transmitting the warning wirelessly to a remote location.

16. The method of claim 13, further comprising altering the performance parameters of a vehicle powered by the battery when the duration of the warning is greater than the predetermined duration.

17. The method of claim 13, further comprising manually or wirelessly resetting the consumption of the internal fluid to zero in response to the level of the internal fluid in the battery being filled in response to the warning.

* * * * *